(12) United States Patent
Zhang

(10) Patent No.: US 9,528,188 B2
(45) Date of Patent: Dec. 27, 2016

(54) METHOD OF IMPROVING LIFETIME OF ETCHING LIQUID AND YIELD IN CU-INTERCONNECTION PROCESS AND CU-INTERCONNECTION ETCHING DEVICE

(71) Applicant: Shenzhen China Star Optoelectronics Technology Co., Ltd., Shenzhen, Guangdong (CN)

(72) Inventor: Xudong Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/428,980

(22) PCT Filed: Feb. 9, 2015

(86) PCT No.: PCT/CN2015/072559
§ 371 (c)(1),
(2) Date: Mar. 18, 2015

(87) PCT Pub. No.: WO2016/095337
PCT Pub. Date: Jun. 23, 2016

(65) Prior Publication Data
US 2016/0177456 A1 Jun. 23, 2016

(30) Foreign Application Priority Data
Dec. 18, 2014 (CN) .......................... 2014 1 0795733

(51) Int. Cl.
C23F 1/14 (2006.01)
C23F 1/08 (2006.01)
(Continued)

(52) U.S. Cl.
CPC . *C23F 1/14* (2013.01); *C23F 1/08* (2013.01); *C23F 1/18* (2013.01); *C23F 1/34* (2013.01); *H01L 21/32134* (2013.01); *H05K 3/00* (2013.01)

(58) Field of Classification Search
CPC ................. C23F 1/14; C23F 1/08; C23F 1/18; C23F 1/34; H01L 21/4803; H01L 21/32134; H05K 2201/0154; H05K 3/00
See application file for complete search history.

(56) References Cited

U.S. PATENT DOCUMENTS 5,350,487 A * 9/1994 Ameen ............... H01L 21/4803
216/83

* cited by examiner

*Primary Examiner* — Nadine Norton
*Assistant Examiner* — Mahmoud Dahimene
(74) *Attorney, Agent, or Firm* — Andrew C. Cheng

(57) ABSTRACT

The present invention provides a method of improving lifetime of etching liquid and yield in Cu-interconnection process and a Cu-interconnection etching device. The method comprises: step 1, providing an etching spray rising tank (1) and an etching liquid tank (2) connected to the etching spray rising tank (1), and the etching liquid tank (2) contains etching liquid; step 2, employing a first concentration monitoring device (4) to measure a copper ion concentration of the etching liquid in the etching liquid tank (2), and employing a filter (5) to perform copper ion filtering to the etching liquid in the etching liquid tank (2); step 3, employing a second concentration monitoring device (6) to measure a copper ion concentration of the etching liquid after filtering in the step 2, and controlling an amount of the filters (5) employed in the step 2 and reflowing the etching liquid after filtering to the etching liquid tank (2). The present invention can reduce the copper ion concentration of the etching liquid to promote the usage lifetime of the etching liquid and reduce the production cost for raising the stability and yield of the Cu-interconnection production.

8 Claims, 2 Drawing Sheets

(51) Int. Cl.
*C23F 1/18* (2006.01)
*C23F 1/34* (2006.01)
*H01L 21/3213* (2006.01)
*H05K 3/00* (2006.01)

step 1, providing an etching spray rising tank (1) and an etching liquid tank (2) connected to the etching spray rising tank (1), and the etching liquid tank (2) contains etching liquid;

step 2, employing a first concentration monitoring device (4) to measure a copper ion concentration of the etching liquid in the etching liquid tank (2), and employing a filter (5) to perform copper ion filtering to the etching liquid in the etching liquid tank (2);

step 3, employing a second concentration monitoring device (6) to measure a copper ion concentration of the etching liquid after filtering in the step 2, and controlling an amount of the filters (5) employed to perform copper ion filtering in the step 2 and reflowing the etching liquid after filtering to the etching liquid tank (2).

Fig. 1

METHOD OF IMPROVING LIFETIME OF ETCHING LIQUID AND YIELD IN CU-INTERCONNECTION PROCESS AND CU-INTERCONNECTION ETCHING DEVICE

FIELD OF THE INVENTION

The present invention relates to a display technology field, and more particularly to a method of improving lifetime of etching liquid and yield in Cu-interconnection process and a Cu-interconnection etching device.

BACKGROUND OF THE INVENTION

With the development of display technology, the flat panel device, such as Liquid Crystal Display (LCD) possesses advantages of high image quality, power saving, thin body and wide application scope. Thus, it has been widely applied in various consumer electrical products, such as mobile phone, television, personal digital assistant, digital camera, notebook, laptop, and becomes the major display device.

Generally, the liquid crystal panel comprises a color filter substrate, an array substrate, liquid crystal sandwiched between the color filter substrate and the array substrate and sealant. Metal lines are formed on the array substrate. The resistance and the RC delay due to the resistance of the metal lines have great influence on the performance of the liquid crystal display panel, and particularly to be more obvious to the large scale and high resolution liquid crystal panel. The array substrate of the present liquid crystal panel commonly utilizes Al-interconnection. The Al-interconnection has higher electrical resistivity and the RC delay coming along with is also larger, which are difficult to be applied for the large scale and high resolution liquid crystal display panel.

Compared with the Al-interconnection, the Cu-interconnection possesses lower electrical resistivity and the RC delay coming along with is smaller, which can satisfy the demands of constant size growing up and high resolution of the liquid crystal display panel. However, in the present Cu-interconnection process, the oxydol series ($H_2O_2$) is commonly utilized as the etching liquid. The issue remains as the etching liquid is in use: With the number increase of the etched substrates, the copper ion concentration of the etching liquid keeps going up. The $H_2O_2$ will have chemical change of acceleration decomposition under the function of the Copper ion, the reaction process is:

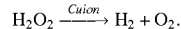

$$H_2O_2 \xrightarrow{Cuion} H_2 + O_2.$$

Furthermore, with the progress of the Cu-interconnection etching process, the copper ion concentration of the etching liquid keeps increasing. The decomposition rate of the $H_2O_2$ gets faster and faster. When the copper ion concentration exceeds 6000 ppm, the decomposition rate of the $H_2O_2$ will rapidly increase and generates a mass of gas which can cause the explosion of the apparatus. Therefore, as the copper ion concentration exceeds 6000 ppm, the new etching liquid has to be replaced, which greatly restricts the usage lifetime of the etching liquid and increases the production cost. Besides, with the copper ion concentration increase of the etching liquid, the etching rate of the etching liquid will also change. Thus, the stability and the yield of the product are influenced.

SUMMARY OF THE INVENTION

An objective of the present invention is to provide a method of improving lifetime of etching liquid and yield in Cu-interconnection process, capable of adjusting the copper ion concentration of the etching liquid to promote the usage lifetime of the etching liquid and reduce the production cost for raising the stability and yield of the Cu-interconnection production.

Another objective of the present invention is to provide a Cu-interconnection etching device, capable of adjusting the copper ion concentration of the etching liquid to promote the usage lifetime of the etching liquid and reduce the production cost for raising the stability and yield of the Cu-interconnection production.

For realizing the aforesaid objective, the present invention first provides a method of improving lifetime of etching liquid and yield in Cu-interconnection process, comprising steps of:

step 1, providing an etching spray rising tank and an etching liquid tank connected to the etching spray rising tank, and the etching liquid tank contains etching liquid;

step 2, employing a first concentration monitoring device to measure a copper ion concentration of the etching liquid in the etching liquid tank, and employing a filter to perform copper ion filtering to the etching liquid in the etching liquid tank;

step 3, employing a second concentration monitoring device to measure a copper ion concentration of the etching liquid after filtering in the step 2, and controlling an amount of the filters employed to perform copper ion filtering in the step 2 and reflowing the etching liquid after filtering to the etching liquid tank.

The etching liquid employed in the step 1 is oxydol series etching liquid;

The filter in the step 2 further comprises one or more reverse osmosis membranes connected in series which can filter the copper ion, one or more filter fabrics connected in series which can filter the copper ion or several reverse osmosis membranes and filter fabrics connected in series which can filter the copper ion.

The amount of the filters employed to perform copper ion filtering is controlled to be activated by a control device according to a variation of the copper ion concentration of the etching liquid measured by the first concentration monitoring device and the second concentration monitoring device and the filters are connected in series.

The etching method of Cu-interconnection is employed for manufacture of an array substrate utilizing the Cu-interconnection; the first concentration monitoring device in the step 2 further measures an oxydol concentration and an additive concentration of the etching liquid; the second concentration monitoring device in the step 3 further measures the oxydol concentration and the additive concentration of the etching liquid.

The present invention further provides a Cu-interconnection etching device, comprising an etching spray rising tank, an etching liquid tank connected to the etching spray rising tank, a liquid pump connected to the etching liquid tank and one or more filters connected to the liquid pump, and the filter is connected to the etching liquid tank, and further comprising a first concentration monitoring device, employed to monitor a copper ion concentration of the etching liquid in the etching liquid tank;

the filter is employed to perform copper ion filtering to the etching liquid to reduce the copper ion concentration of the etching liquid.

The first concentration monitoring device is located in the etching liquid tank, between the etching liquid tank and the liquid pump, or between the liquid pump and the filter.

The Cu-interconnection etching device further comprises a second concentration monitoring device, and the second concentration monitoring device is located between the filter and the etching liquid tank and employed to monitor the copper ion concentration of the etching liquid after filtering; the first concentration monitoring device further monitors an oxydol concentration and an additive concentration of the etching liquid in the etching liquid tank; the second concentration monitoring device further monitors the oxydol concentration and the additive concentration of the etching liquid after filtering.

An amount of the filters is many and connected in series, and the Cu-interconnection etching device further comprises a control device, and the control device is respectively and electrically connected to the first concentration monitoring device, the second concentration monitoring device and every filter, to be employed to control whether every filter performs copper ion filtering or not according to concentration monitoring result.

The every filter further comprises one or more reverse osmosis membranes connected in series which can filter the copper ion, one or more filter fabrics connected in series which can filter the copper ion or several reverse osmosis membranes and filter fabrics connected in series which can filter the copper ion.

The Cu-interconnection etching device is employed for a process of an array substrate utilizing the Cu-interconnection.

The present invention provides a method of improving lifetime of etching liquid and yield in Cu-interconnection process, comprising steps of:

step 1, providing an etching spray rising tank and an etching liquid tank connected to the etching spray rising tank, and the etching liquid tank contains etching liquid;

step 2, employing a first concentration monitoring device to measure a copper ion concentration of the etching liquid in the etching liquid tank, and employing a filter to perform copper ion filtering to the etching liquid in the etching liquid tank;

step 3, employing a second concentration monitoring device to measure a copper ion concentration of the etching liquid after filtering in the step 2, and controlling an amount of the filters employed in the step 2 and reflowing the etching liquid after filtering to the etching liquid tank;

wherein the etching liquid employed in the step 1 is oxydol series etching liquid;

wherein the filter in the step 2 further comprises one or more reverse osmosis membranes connected in series which can filter the copper ion, one or more filter fabrics connected in series which can filter the copper ion or several reverse osmosis membranes and filter fabrics connected in series which can filter the copper ion.

The benefits of the present invention are: the present invention provides a method of improving lifetime of etching liquid and yield in Cu-interconnection process and a Cu-interconnection etching device. By adding the filter in the recycle process of the etching liquid to constantly filter the copper ion of the etching liquid and reflowing the etching liquid after filtering to the etching liquid tank for cyclic utilization, accordingly, the copper ion concentration of the etching liquid can be reduced to promote the usage lifetime of the etching liquid and reduce the production cost for raising the stability and yield of the Cu-interconnection production.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings,

FIG. 1 is a flowchart of an etching method of Cu-interconnection according to the present invention.

DETAILED DESCRIPTION OF PREFERRED EMBODIMENTS

Figure 2:
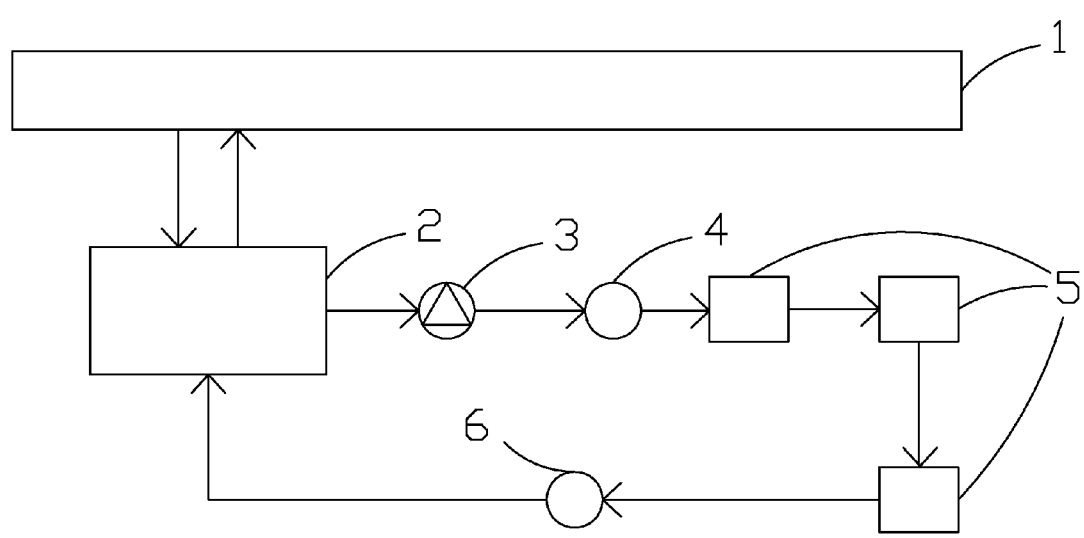
FIG. 2 is a structural diagram of an etching device of Cu-interconnection according to the present invention.

For better explaining the technical solution and the effect of the present invention, the present invention will be further described in detail with the accompanying drawings and the specific embodiments.

Please refer to FIG. 1 in conjunction with FIG. 2. The present invention first provides a method of improving lifetime of etching liquid and yield in Cu-interconnection process, comprising steps of:

step 1, providing an etching spray rising tank 1 and an etching liquid tank 2 connected to the etching spray rising tank 1, and the etching liquid tank 2 contains etching liquid.

Specifically, the etching liquid employed in the step 1 is oxydol series etching liquid.

step 2, employing a first concentration monitoring device 4 to measure a copper ion concentration of the etching liquid in the etching liquid tank 2, and employing a filter 5 to perform copper ion filtering to the etching liquid in the etching liquid tank 2.

Specifically, the filter 5 in the step 2 further comprises one or more reverse osmosis membranes connected in series which can filter the copper ion, one or more filter fabrics connected in series which can filter the copper ion or several reverse osmosis membranes and filter fabrics connected in series which can filter the copper ion. In the step 2, several filters 5 can be utilized, and the filters 5 are connected in series. Furthermore, a method of setting a cyclic tank can be employed to collect the copper ion after filtering for the recycle of the copper ion.

The first concentration monitoring device 4 can be directly located in the etching liquid tank 2, between the etching liquid tank 2 and the liquid pump 3, and respectively connected to the etching liquid tank 2 and the liquid pump 3, or between the liquid pump 3 and the filter 5, and respectively connected to the liquid pump 3 and the filter 5, and employed to monitor the copper ion concentration in the etching liquid tank 2, and ensure the normal usage of the etching liquid in the etching liquid tank 2. Besides, the first concentration monitoring device 4 further measures an oxydol concentration and an additive concentration of the etching liquid for adding the additive in time to ensure the quality of the etching liquid and the etching result of the Cu-interconnection.

step 3, employing a second concentration monitoring device to measure a copper ion concentration of the etching liquid after filtering in the step 2, and controlling an amount of the filters 5 employed to perform copper ion filtering in the step 2 and reflowing the etching liquid after filtering to the etching liquid tank 2.

Specifically, in the step 3, the amount of the filters 5 employed to perform copper ion filtering is controlled to be activated by a control device according to a variation of the copper ion concentration of the etching liquid measured by the first concentration monitoring device 4 and the second concentration monitoring device 6. If the copper ion concentration of the etching liquid after filtering is lower than the demanded copper ion concentration of the etching liquid, the amount of the filters 5 employed to perform copper ion filtering is decreased. If the copper ion concentration of the etching liquid after filtering is higher than the demanded copper ion concentration of the etching liquid, the amount of the filters 5 employed to perform copper ion filtering is increased. Furthermore, the program can be set in the control device to realize the automatic adjustment to maintain the copper ion concentration at the best stable value.

The step 3 further comprises a step of measuring an oxydol concentration and an additive concentration of the etching liquid after filtering with the filter 5 by a second concentration monitoring device 6; wherein the copper ion concentration of the etching liquid after filtering is monitored to ensure the filtering result; the oxydol concentration and the additive concentration of the etching liquid are monitored for adding the additive in time to ensure the quality of the etching liquid and the etching result of the Cu-interconnection when the filter causes the additive concentration loss.

At last, the Cu-interconnection etching method is employed for manufacture of an array substrate utilizing the Cu-interconnection.

Please refer to FIG. 2. The present invention further provides a Cu-interconnection etching device, comprising an etching spray rising tank 1, an etching liquid tank 2 connected to the etching spray rising tank 1, a liquid pump 3 connected to the etching liquid tank 2 and one or more filters 5 connected to the liquid pump 3, and the filter 5 is connected to the etching liquid tank 2, and further comprising a first concentration monitoring device 4, employed to monitor a copper ion concentration of the etching liquid in the etching liquid tank 2; the filter 5 is employed to perform copper ion filtering to the etching liquid to reduce the copper ion concentration of the etching liquid.

The first concentration monitoring device 4 can be directly located in the etching liquid tank 2, between the etching liquid tank 2 and the liquid pump 3, and respectively connected to the etching liquid tank 2 and the liquid pump 3, or between the liquid pump 3 and the filter 5, and respectively connected to the liquid pump 3 and the filter 5, and employed to monitor the copper ion concentration in the etching liquid tank 2, and ensure the normal usage of the etching liquid in the etching liquid tank 2. Besides, the first concentration monitoring device 4 further measures an oxydol concentration and an additive concentration of the etching liquid for adding the additive in time to ensure the quality of the etching liquid and the etching result of the Cu-interconnection.

Particularly, the filter 5 is employed to filter the copper ion of the etching liquid to reduce the copper ion concentration of the etching liquid. The filter 5 can be any device which can filter the copper ion. Specifically, the filter 5 can comprise one or more reverse osmosis membranes connected in series which can filter the copper ion to realize rapid copper ion filtering. The reverse osmosis membranes can be regularly replaced according to the usage efficiency to ensure the filtering quality. Moreover, the filter 5 can comprise one or more filter fabrics connected in series which can filter the copper ion. The filter 5 also can comprise several reverse osmosis membranes and filter fabrics connected in series which can filter the copper ion. Besides, the filter 5 can further comprise a cyclic tank (not shown), employed to collect the copper ion after filtering for the recycle of the copper ion.

The Cu-interconnection etching device further comprises a second concentration monitoring device 6, and the second concentration monitoring device 6 is respectively connected to the filter 5 and the etching liquid tank 2 to monitor the copper ion concentration of the etching liquid after filtering to ensure the filtering result. Meanwhile, the second concentration monitoring device 6 can further monitor the oxydol concentration, the additive concentration of the etching liquid for adding the additive in time according to the monitor data when the filter 5 causes the additive concentration loss.

Besides, the amount of the filters 5 can be increased or decreased according to the copper ion concentration demand of the etching process. Preferably, the Cu-interconnection etching device further comprises a control device, and the control device is respectively and electrically connected to the first concentration monitoring device 4, the second concentration monitoring device 6 and every filter 5, to be employed to control whether every filter 5 performs copper ion filtering or not according to concentration monitoring result. Specifically, the control device obtains the copper ion concentration data of the etching liquid before filtering from the first concentration monitoring device 4, and obtains the copper ion concentration data of the etching liquid after filtering from the second concentration monitoring device 6, and monitors whether the filtering result reaches the target or not according to a variation of the copper ion concentration of the etching liquid before and after filtering and the copper ion concentration data of the etching liquid demanded by the etching process. If the copper ion concentration of the etching liquid after filtering is lower than the demanded copper ion concentration of the etching liquid, the amount of the filters 5 employed to perform copper ion filtering is decreased. If the copper ion concentration of the etching liquid after filtering is higher than the demanded copper ion concentration of the etching liquid, the amount of the filters 5 employed to perform copper ion filtering is increased. Thus, the real time adjustment of the copper ion concentration of the etching liquid can be achieved. Furthermore, the program can be set in the control device to realize the automatic adjustment to maintain the copper ion concentration at the best stable value.

At last, the Cu-interconnection etching device is employed for a process of an array substrate utilizing the Cu-interconnection.

In conclusion, the present invention provides a method of improving lifetime of etching liquid and yield in Cu-interconnection process and a Cu-interconnection etching device. By adding the filter in the recycle process of the etching liquid to constantly filter the copper ion of the etching liquid and reflowing the etching liquid after filtering to the etching liquid tank for cyclic utilization, accordingly, the copper ion concentration of the etching liquid can be reduced to promote the usage lifetime of the etching liquid and reduce the production cost for raising the stability and product yield of the Cu-interconnection production.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A method of improving lifetime of etching liquid and yield in Cu-interconnection process, comprising the following steps:
   step 1, providing an etching liquid tank that contains etching liquid;
   step 2, providing a first concentration monitoring device to measure a copper ion concentration of the etching liquid in the etching liquid tank, and operating a filter arranged downstream the etching liquid tank to receive the etching liquid from the etching liquid tank and perform copper ion filtering to the etching liquid so as to provide filtered etching liquid; and
   step 3, providing a second concentration monitoring device arranged downstream the filter to measure a copper ion concentration of the filtered etching liquid of step 2, and allowing the filtered etching liquid to flow back to the etching liquid tank;
   wherein the first concentration monitoring device provides a first measurement of copper ion concentration of the etching liquid that is measured upstream the filter and the second concentration monitoring device provides a second measurement of copper ion concentration of the filtered etching liquid that is measured downstream the filter and a variation between the first and second measurements controls an operation of the filter to filter the etching liquid passing therethrough by selectively employing a number of filter units of the filter, the filter units being connected in series.

2. The method of improving lifetime of etching liquid and yield in Cu-interconnection process according to claim 1, wherein the etching liquid is $H_2O_2$ based etching liquid.

3. The method of improving lifetime of etching liquid and yield in Cu-interconnection process according to claim 1, wherein the filter units of the filter in step 2 further comprise one or more reverse osmosis membranes connected in series which can filter copper ion, one or more filter fabrics connected in series which can filter copper ion or several reverse osmosis membranes and filter fabrics connected in series which can filter copper ion.

4. The method of improving lifetime of etching liquid and yield in Cu-interconnection process according to claim 1, wherein the amount of the filters employed to perform copper ion filtering is controlled to be activated by a control device according to the variation of the first and second measurements of copper ion concentration measured by the first concentration monitoring device and the second concentration monitoring device.

5. The method of improving lifetime of etching liquid and yield in Cu-interconnection process according to claim 1, wherein the Cu-interconnection process is applicable to manufacture of an array substrate comprising Cu-interconnection; and the first concentration monitoring device in step 2 further measures $H_2O_2$ concentration and a concentration of an additive of the etching liquid and the second concentration monitoring device in step 3 further measures $H_2O_2$ concentration and the concentration of the additive of the etching liquid.

6. A method of improving lifetime of etching liquid and yield in Cu-interconnection process, comprising the following steps:
   step 1, providing an etching liquid tank that contains etching liquid;
   step 2, providing a first concentration monitoring device to measure a copper ion concentration of the etching liquid in the etching liquid tank, and operating a filter arranged downstream the etching liquid tank to receive the etching liquid from the etching liquid tank and perform copper ion filtering to the etching liquid so as to provide filtered etching liquid; and
   step 3, providing a second concentration monitoring device arranged downstream the filter to measure a copper ion concentration of the filtered etching liquid of step 2, and allowing the filtered etching liquid to flow back to the etching liquid tank;
   wherein the first concentration monitoring device provides a first measurement of copper ion concentration of the etching liquid that is measured upstream the filter and the second concentration monitoring device provides a second measurement of copper ion concentration of the filtered etching liquid that is measured downstream the filter and a variation between the first and second measurements controls an operation of the filter to filter the etching liquid passing therethrough by selectively employing a number of filter units of the filter, the filter units being connected in series;
   wherein the etching liquid is $H_2O_2$ based etching liquid; and
   wherein the filter units of the filter in step 2 further comprise one or more reverse osmosis membranes connected in series which can filter copper ion, one or more filter fabrics connected in series which can filter copper ion or several reverse osmosis membranes and filter fabrics connected in series which can filter copper ion.

7. The method of improving lifetime of etching liquid and yield in Cu-interconnection process according to claim 6, wherein the amount of the filters employed to perform copper ion filtering is controlled to be activated by a control device according to the variation of the first and second measurements of copper ion concentration measured by the first concentration monitoring device and the second concentration monitoring device.

8. The method of improving lifetime of etching liquid and yield in Cu-interconnection process according to claim 6, wherein the Cu-interconnection process is applicable to manufacture of an array substrate comprising Cu-interconnection; and the first concentration monitoring device in step 2 further measures $H_2O_2$ concentration and a concentration of an additive of the etching liquid and the second concentration monitoring device in step 3 further measures $H_2O_2$ concentration and the concentration of the additive of the etching liquid.

* * * * *